(12) United States Patent
Malone et al.

(10) Patent No.: US 7,298,619 B1
(45) Date of Patent: Nov. 20, 2007

(54) CABLE MANAGEMENT ARM WITH INTEGRATED HEAT EXCHANGER

(75) Inventors: Christopher Gregory Malone, Roseville, CA (US); Bryan Bolich, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 11/416,561

(22) Filed: May 2, 2006

(51) Int. Cl.
*H05K 5/03* (2006.01)
(52) U.S. Cl. ...................... 361/699; 361/698; 361/724; 361/727; 174/16.3; 174/36; 174/78; 165/80.2; 165/80.3; 165/80.4; 165/80.5
(58) Field of Classification Search ............... 361/687, 361/698, 699, 700–702, 724, 712–714, 725, 361/727, 831; 174/16.3, 36, 78, 50, 51; 165/80.2, 165/80.3, 80.4, 80.5; 312/223.2, 223.3; 454/184
See application file for complete search history.

(56) References Cited

U.S. PATENT DOCUMENTS

| 5,624,312 | A | 4/1997 | Collier | |
| 6,452,093 | B1 * | 9/2002 | Ishii et al. | 174/16.3 |
| 6,791,841 | B1 * | 9/2004 | Tirrell et al. | 361/724 |
| 2005/0207116 | A1 | 9/2005 | Yatskov et al. | |

* cited by examiner

*Primary Examiner*—Michael Datskovskiy

(57) ABSTRACT

In electronic and/or electrical equipment, a cable management assembly is configured for usage in an electronic and/or electrical equipment rack assembly. The cable management assembly comprises at least two arm members, at least one flexible coupling configured to attach two of the at least two arm members, and connectors configured to flexibly attach an electronic and/or electrical equipment component to an electronic and/or electrical equipment rack. The at least two arm members, the at least one flexible coupling, and the connectors are constructed from a material that removes heat from interior to the rack and is connected in a configuration that draws the removed heat to a heat sink element.

20 Claims, 7 Drawing Sheets

CABLE MANAGEMENT ARM WITH INTEGRATED HEAT EXCHANGER

BACKGROUND

Electronic systems and equipment such as computer systems, network interfaces, storage systems, and telecommunications equipment are commonly enclosed within a cabinet, rack, or housing for support, physical security, and efficient usage of space. Electronic equipment contained within the enclosure generates a significant amount of heat. Thermal damage may occur to the electronic equipment unless the heat is removed.

Some computer systems, for example network systems, often have multiple separate computer units or servers positioned and stacked in a cabinet or rack. The servers are electrically interconnected and perform functions such as storage, communications, computations, and the like. The rack includes support columns for securing the individual computer servers, typically using opposing slide assemblies which attach to the columns. Slide assemblies enable a server to be extracted from the rack, typically at the front but possibly at the rear or sides, so that individual servers can be serviced for maintenance, replacement of computer cards, or other operations while the server remains in operation.

A typical server has a back panel coupled to several input and output cables which include power cables, data cables, communication lines, keyboard lines, and others. Some type of cable management device, for example a cable management arm, may be used to collect the cables at the back of the server and rack for convenience and organization. The cable management arm is typically mounted to the rack and to the server in such a manner that when the computer server is pulled out of the rack on the slide assemblies, the cable management arm unfolds and extends to allow the cables mounted thereto to be maintained in their organized state.

SUMMARY

In accordance with an embodiment of an electronic and/or electrical equipment assembly, a cable management assembly is configured for usage in an electronic and/or electrical equipment rack assembly. The cable management assembly comprises at least two arm members, at least one flexible coupling configured to attach two of the at least two arm members, and connectors configured to flexibly attach an electronic and/or electrical equipment component to an electronic and/or electrical equipment rack. The at least two arm members, the at least one flexible coupling, and the connectors are constructed from a material that removes heat from interior to the rack and is connected in a configuration that draws the removed heat to a heat sink element.

BRIEF DESCRIPTION OF THE DRAWINGS

Embodiments of the invention relating to both structure and method of operation may best be understood by referring to the following description and accompanying drawings.

DETAILED DESCRIPTION

Cable management arms (CMA) may be used to enable rack-mount servers with rails to be temporarily pulled from electronics racks for servicing. The cable management arms may create airflow resistance, particularly for more compact servers, thereby impacting system cooling. In addition, cable management arms may force placement of power and signal cables in positions within the highest temperature airstreams in the rack or cabinet. Cables have temperature limits for data integrity and current-carrying capabilities that may be violated due to the high temperature air stream.

Accordingly, a cable management arm may be constructed using techniques, structures, and/or materials that remove heat from the rack cabinet.

In an illustrative embodiment, a cable management arm may be constructed from tubing which enables coolant to be circulated through the assembly to control exit air temperature from information technology (IT) equipment.

In another example embodiment, a cable management arm can be constructed from a material with high thermal conductivity, enabling cooling in a similar manner.

The cable management arm with integrated heat exchange capability enables moderation of temperature within air exiting servers, control of cable temperature, and reduction or minimization of the heating impact of high-power servers on data center cooling.

Figure 1A:
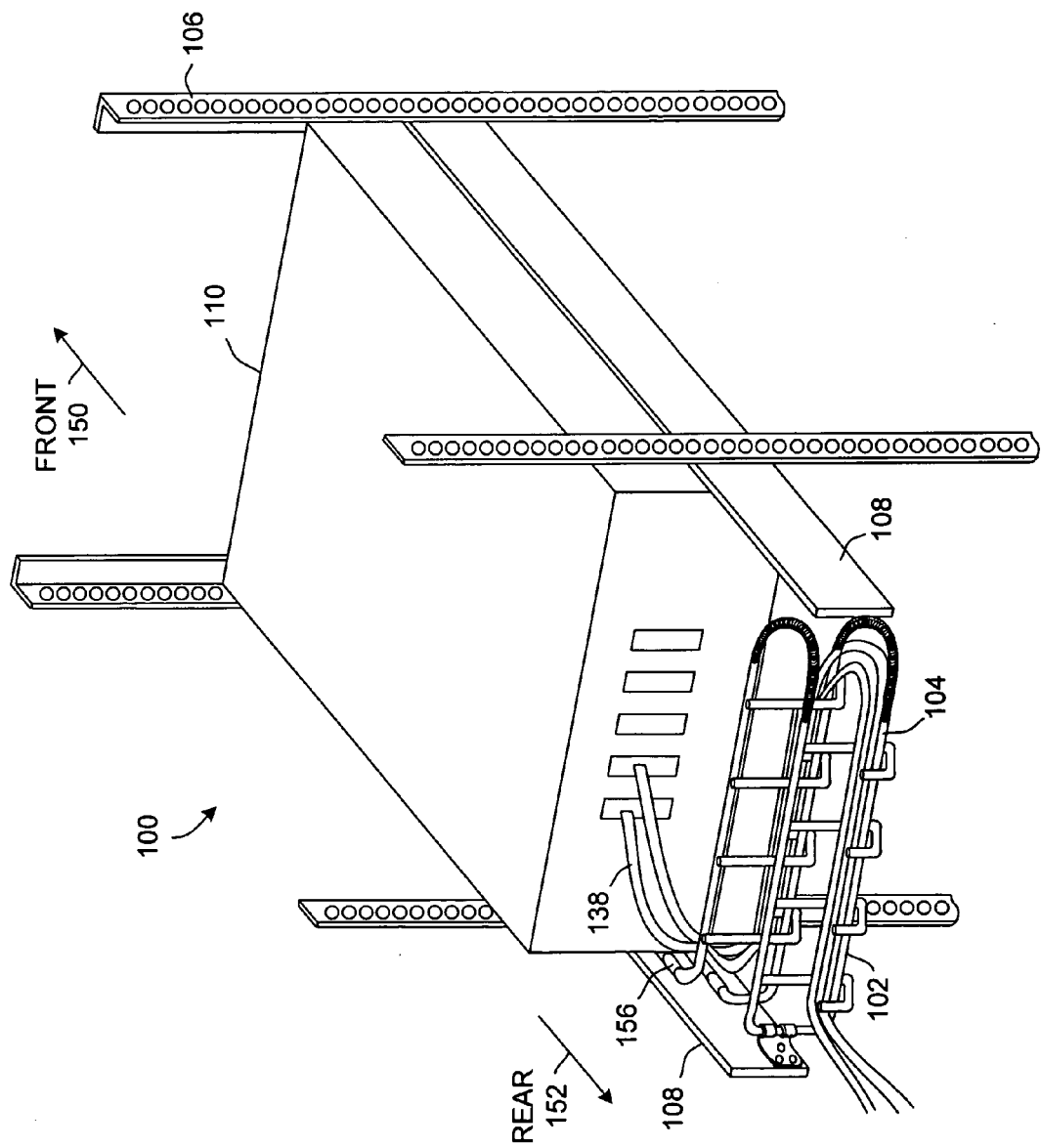
FIG. 1A is a schematic pictorial perspective view diagram illustrating an embodiment of an electronic and/or electrical equipment rack assembly configured for usage with a cable management assembly with an integrated heat exchanger.

Referring to FIG. 1A, a schematic pictorial perspective view diagram illustrates an embodiment of an electronic and/or electrical equipment rack assembly 100 configured for usage with a cable management assembly 102 with an integrated heat exchanger 104. The illustrative electronic and/or electrical equipment rack assembly 100 comprises an electronic and/or electrical equipment rack 106, a plurality of sliding rails 108 coupled to the rack 106 and configured to slideably attach an electronic and/or electrical equipment component 110 to the rack 106, and at least one cable management assembly 102 coupled to the rack 106.

The illustrative electronic and/or electrical equipment rack assembly 100 enables cooling interior to the electronic and/or electrical equipment rack 106. Interior to the rack 106 is cooled by mounting one or more electronic and/or electrical equipment components 110 in the rack 106 and mounting signal and or power cabling 138 of the electronic and/or electrical equipment component or components 110 on a cable management assembly 102 associated with the component 110. Airflow is drawn through the front 150 of the rack 106 across the electronic and/or electrical equipment components 110 to the rear 152 of the rack 106 in a manner such that heat is transferred from the components 110 to the air. The integrated heat exchanger 104 conducts heat and/or passes heat by convection through the cable management assembly or assemblies 102 to a heat sink. The illustrative liquid loop management assembly 102 is attached to the rear of sliding rails 108. The liquid loop cable management assembly 102 can be coupled to fluid supply lines 156 that connect to a cooling fluid source or heat sink which removes heat form the circulating coolant for a closed-loop cycle.

The cable management arm 102 typically attaches as a moving arm to the rear of a server 110. In the illustrative embodiment, the cable management assembly 102 is formed in a serpentine pattern that unfolds as the server 110 is removed from the rack 106. In the illustrative liquid loop cooling application, tubes carrying heated liquid and cooled liquid can be extended outside the servers 110 and structurally incorporated into the cable management arm 102. In some arrangements, the cable management arm 102 can be part of the tubing assembly through which the coolant circulates. Accordingly, as heated air leaves the server 110 a supply of cool water or other coolant entering the server cools the exit air leaving the server, enabling a multifaceted cooling effect applied within the servers 110 and in the air stream external to the servers 110 within the rack 106. The cooling effect is attained as coolant enters the server 110 and heat is conducted to the fluid through cold plates attached to various components such as processors and the like. Coolant exits the server 110 at a higher temperature, passes through the tubes in the cable management arm 102, removing heat from the air exiting the server 110 by convection.

In other liquid loop cooling arrangements, the cooling tubes may be routed through the cable management arm but only exterior to the servers. The cable management assembly 102 arrangement with the liquid loop cooling only exterior to the servers, controls exit air temperature from the servers while also enabling management of power and signal cables exiting the servers. Coolant travels through cable management arm 102, cooling hot air from the server by heat transfer with the liquid. The cable management assembly 102 returns heated air from the servers to the room at a temperature lower than the server exit air temperature, ideally at or below the server inlet temperature. The lowered temperature reduces or minimizes the impact of the server's heat generation on the surrounding data center or office environment. Accordingly, the server can be made neutral to the room with respect to heat transfer via removal of heat by the coolant loop.

Figure 1B:
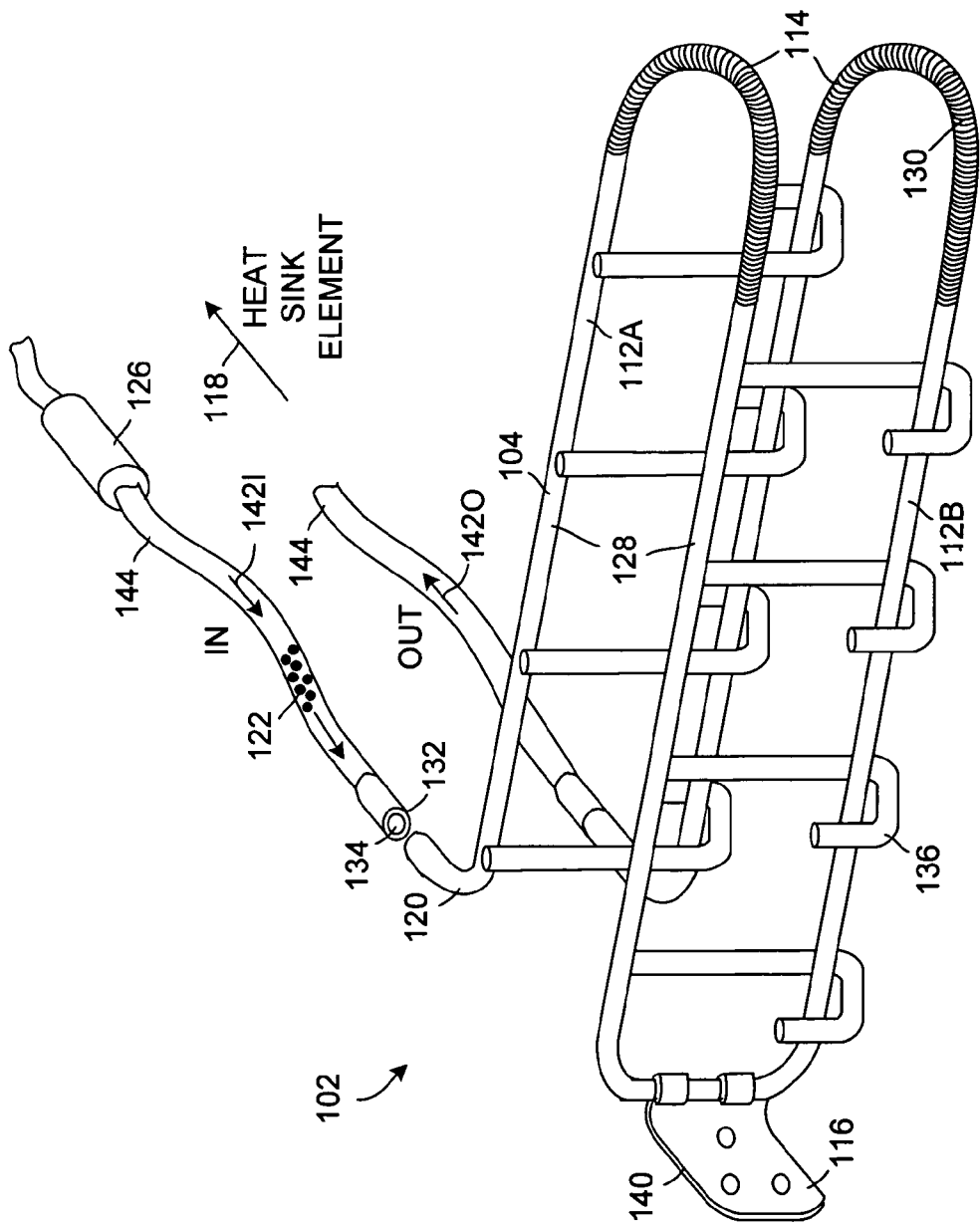
FIG. 1B is a schematic pictorial perspective view diagram depicting an embodiment of a cable management assembly configured with an integrated heat exchanger.

Referring to FIG. 1B, a schematic pictorial perspective view diagram depicts an embodiment of a cable management assembly 102 configured with an integrated heat exchanger 104. The cable management assembly 102, which may be called a cable management arm, comprises two or more arm members 112A and 112B, at least one flexible coupling 114 configured to attach two 112A and 112B of the two or more arm members, and connectors 116. The connectors 116 are configured to flexibly attach the cable management assembly 102 to the rack 106. The two or more arm members 112A and 112B, and the at least one flexible coupling 114 are constructed from a material or materials that remove heat from interior to the rack and connected in a configuration that draws the removed heat to a heat sink element 118.

In the illustrative embodiment, the arm members 112A and 112B comprise one or more liquid loop cooling tubes 120 configured to circulate a liquid coolant 122. A heat exchanger 118 or other heat sink component coupled to the liquid loop cooling tubes 120 is configured to cool the circulating liquid coolant 122 and return the cooled circulating liquid to the liquid loop cooling tubes 120.

Liquid coolant fluid 122 circulates through the cable management assembly and cooling air passes over the cable management assembly 102 by heat transfer to the liquid cooling fluid 122 with liquid coolant fluid 122 circulating through a heat exchanger 118. The liquid coolant fluid 122 can be cooled at the heat exchanger 118 by transfer to another liquid loop such as a chilled water supply and/or refrigeration.

In some arrangements, a pump 126 may be included as part of the cable management assembly 102 and configured to pump the circulating liquid 122 through the liquid loop cooling tubes 120 and the heat exchanger 118. In various arrangements, the pump 126 may be positioned in any suitable location. For example, a pump may be contained within a server chassis of an electronic and/or electrical equipment component 110. In another case, the pump may be located within or attached to the rack 106. In a typical arrangement, one pump drives coolant flow through multiple individual cable management arms.

In other arrangements, the cable management assembly 102 may be implemented with no associated pump. For example, the heat exchanger 118 may be configured to cool the circulating liquid 122 by refrigeration or by transfer from a chilled water supply. Pressure for driving the liquid coolant 122 through the liquid loop cooling tubes 120 may be supplied via water pressure of chilled water in the building containing the rack 106.

In one approach for supplying cooling to a cable management arm, the CMA can be constructed from a tubular material which permits a liquid coolant to be circulated through the interior of the cable management arm. Hot air passing over the CMA is cooled by heat transfer with the liquid. The hot liquid may be returned to a rack-level heat exchanger where hot liquid from all cable management arms in the rack can be cooled by building chilled water or refrigeration.

In another configuration, the liquid coolant loop can be arranged to extend into the server so that coolant is pumped into the server to cool components within using cold plates. Liquid heated by transfer from the components can be cooled, at least partially, using an in-server heat sink or may exit the server be driven to a cold plate, refrigeration unit, or building-supplied chilled water, or other cooling element associated with the rack or the building. A pump or pumps for driving the cooling through the liquid loop can be contained and deliver localized pressure within the server or within the rack, or can be coupled to the building-supplied chilled water supply.

As shown in FIG. 1B, an implementation of the cable management assembly 102 comprises a liquid loop cooling tube 120 configured in a plurality of rigid segments 128 coupled by flexible tubing segments 130. The tube 120 comprises walls 132 formed about a hollow lumen 134 that enables circulation of the liquid coolant 122. The tube 120 forms a hollow structure that enables fluid flow of a coolant 122, supplying thermal conduction. The diagram includes arrows showing the direction of fluid flow. The flexible tubing segments 130 are shown in a configuration that enables hinge functionality and extension and retraction of the cable management assembly 102. The flexible tubing segments 130 enable the cable management assembly 102 to extend while maintaining fluid flow. The cable management assembly 102 further comprises at least one retention element 136 coupled to the liquid loop cooling tube 120 in a configuration adapted to retain electronic and/or electrical equipment cabling 138. The illustrative example shows retention elements 136 in the form or hooks in a configuration suitable for holding cables, enabling cable routing in a structure that retains cables in an appropriate position and geometry. The cable management assembly 102 further comprises fasteners 140 that attach the assembly 102 to a sliding rail that holds the electronic and/or electrical equipment component 110, such as a server. Inlet tubes 142I and outlet tubes 142O coupled to the tube 120 may be connected to liquid cooling loop connections 144 to data center cooling lines or another suitable cooling source.

In another approach for supplying cooling to a cable management arm, the CMA can be constructed from a material with high thermal conductivity. Heat from the server exhaust air can be transferred to the cable management arm by convection and conducted to a central high-conductivity strip or cold plate in a rack column where the heat is removed to building chilled water or external data center ambient air.

Some configurations may implement a heat transfer mode with multiple steps of conduction. For example, the thermally-conductive cable management arm may couple to a copper plate or thermosyphon on the rack which is further coupled to a cold plate that extends the length of the rack. At an end of the rack, for example at the rack base, the rack-length cold plate can conduct heat to building-chilled water.

Figure 2A:
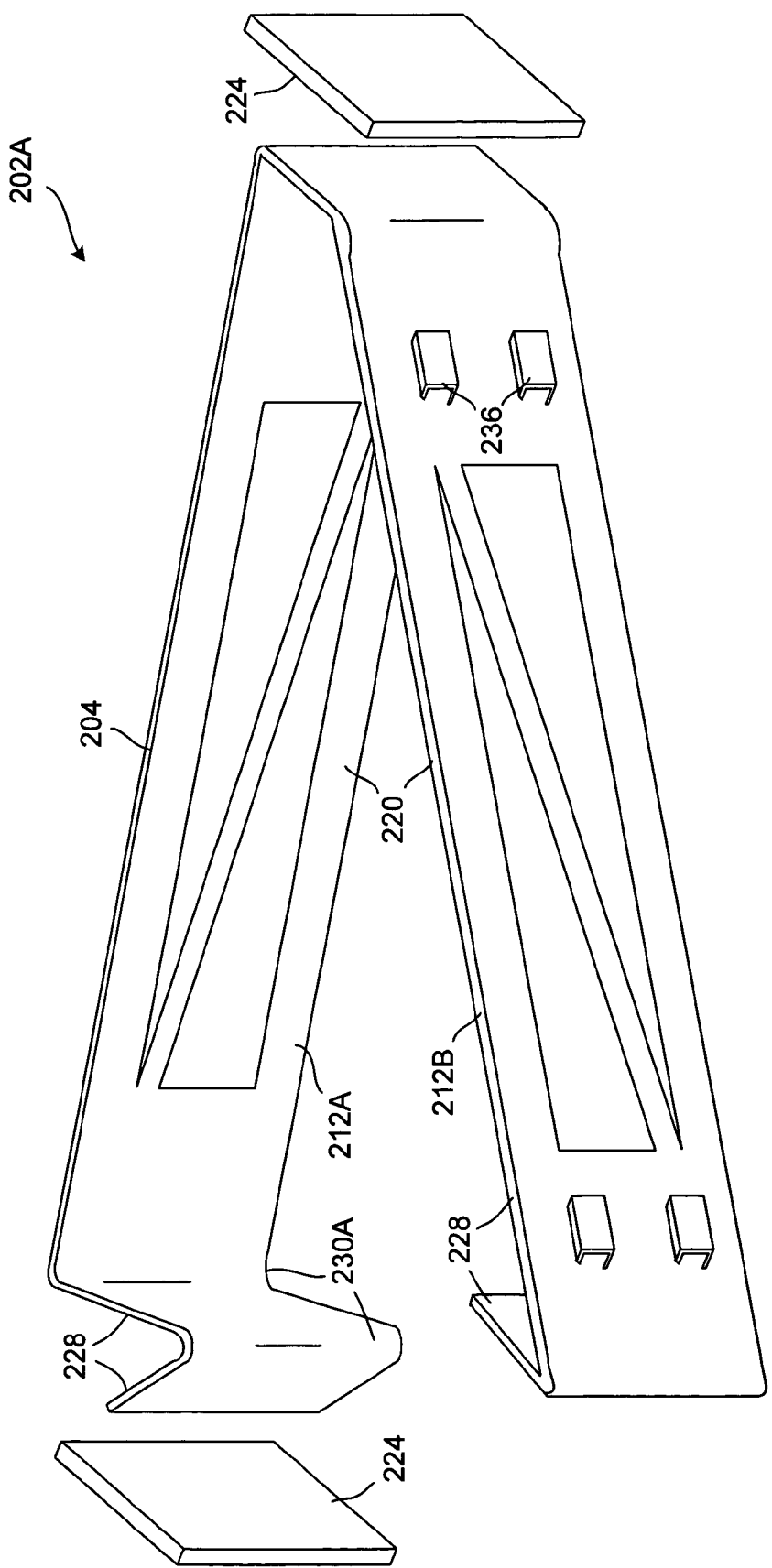
FIGS. 2A through 2C are schematic pictorial perspective view diagrams showing other embodiments of a cable management assembly configured with a different type of integrated heat exchanger.
Figure 2B:
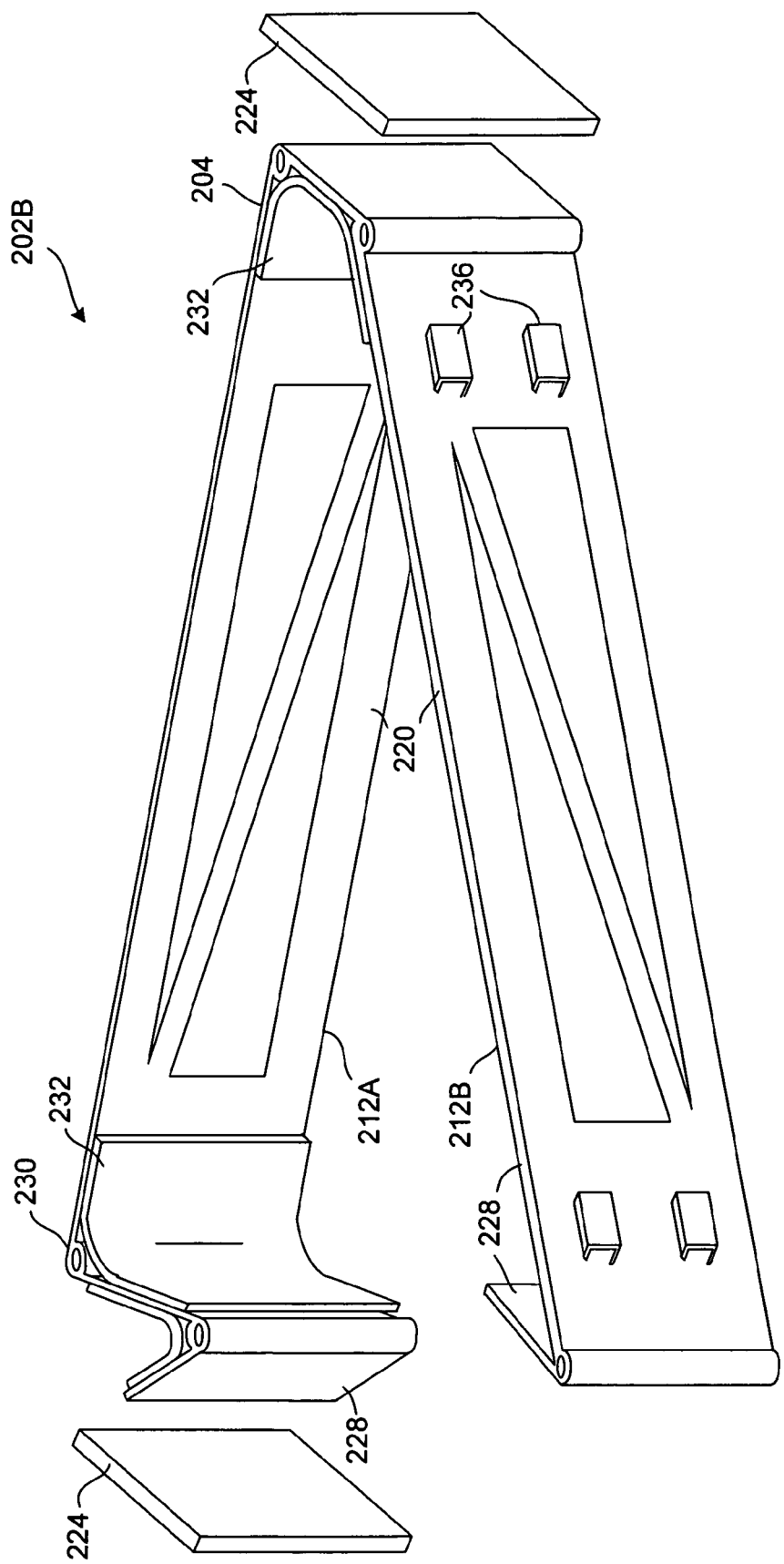
Figure 2C:
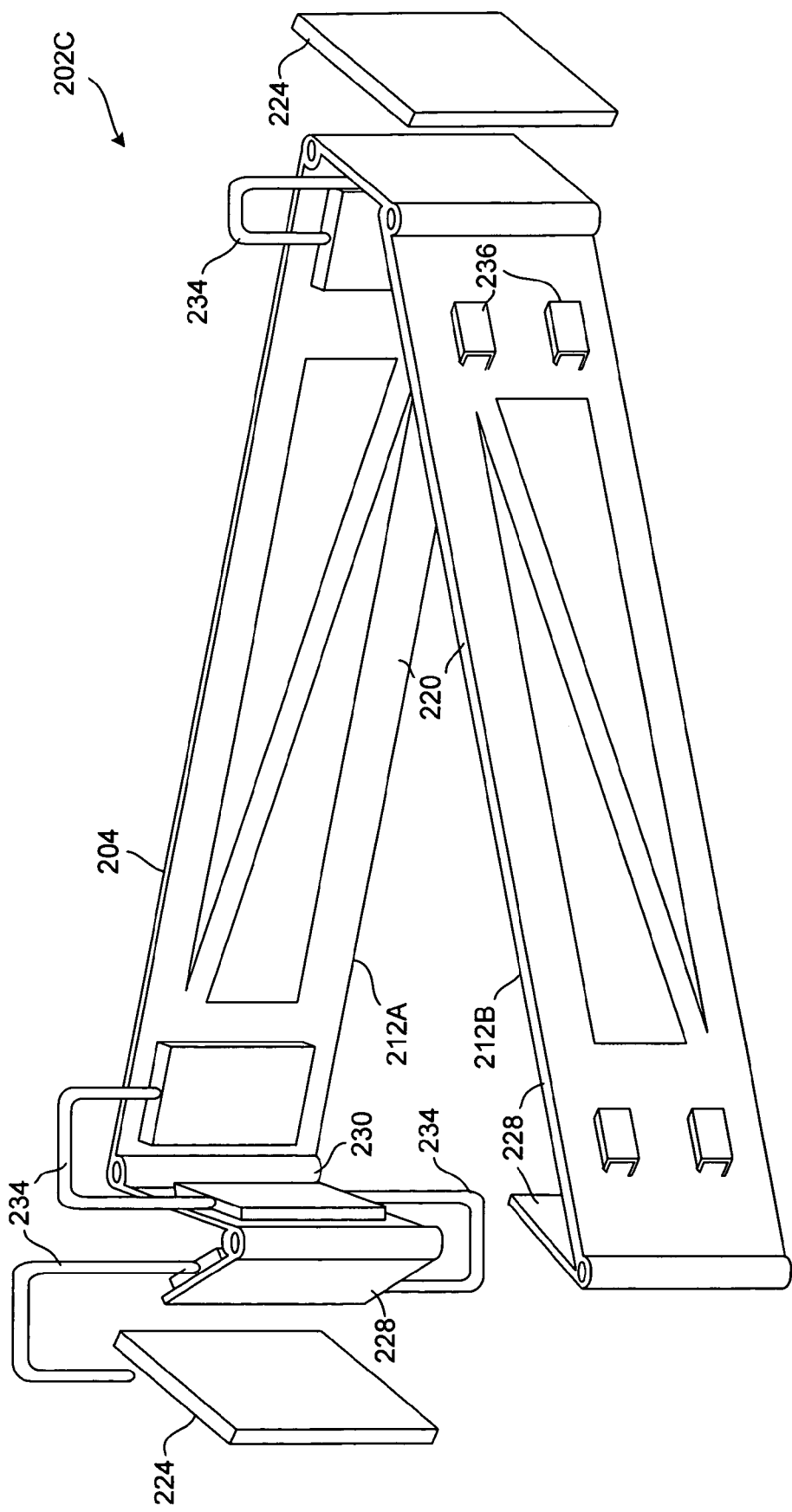

Referring to FIGS. 2A, 2B, and 2C, schematic pictorial perspective view diagrams show other embodiment of cable management assemblies 202A, 202B, and 202C configured with a different type of integrated heat exchanger 204. The cable management assemblies 202A, 202B, and 202C each comprise two or more arm members 212A, 212B include a plurality of segments 220 constructed from a high thermal conductivity material which is configured to transfer heat by convection and/or conduction. One example of a high thermal conductivity material is copper or a copper alloy. Another example is a heat pipe. A further example is a vapor chamber, a low profile or flattened heat pipe with a thin profile and larger planar area that can be constructed into the cable management arm. The illustrative cable management assemblies 202A, 202B, and 202C further comprise a high-conductivity strip and/or cold plate 224 coupled to the segments 220 and is configured to sink transferred heat from the segments 220.

Heat is conducted and/or passed through convection through the cable management assemblies 202A, 202B, and 202C which are constructed of a material with high thermal conductivity. Cooling air passes over the cable management assembly 202 by heat transfer to the material with high thermal conductivity. Heat on the cable management assembly 202 is transferred to the high-conductivity strip and/or cold plate 224.

In one example arrangement, a cable management arm may be constructed from a high thermal conductivity material, such as copper, and bolted to a rack column which also has high thermal conductivity or to a cold plate. The thermally conductive rack column or cold plate can be cooled using building-supplied chilled water or another heat removal source. For example, a thermal bus bar or cold plate may be connected to the rack and function as a suitable heat sink whereby a cable management arm constructed from copper or other high conductivity material, or a heat pipe may connect to the bus bar or cold plate. The thermal bus bar or cold plate may have a relatively large surface area that passes heat along to a location of the rack where heat can be radiated by natural or forced convection.

In an example arrangement, the high-conductivity strip and/or cold plate 224 may be configured to cool the circulating liquid by refrigeration or by transfer from a chilled water supply. Accordingly, the high-conductivity strip and/or cold plate 224 is cooled by heat transfer to a chilled water supply and/or refrigeration.

In the illustrative arrangement, the segments 220 may be configured in a plurality of rigid segments 228 coupled by hinge elements 230 which enable extension and retraction of the cable management assemblies 202A, 202B, and 202C. The cable management assembly 202 further comprises at least one retention element 236 coupled to the segments 220 in a configuration which can retain electronic and/or electrical equipment cabling. The hinges 230 are flexible structures which facilitate movement of the cable management assemblies 202A, 202B, and 202C but present a relatively high resistance to conductive heat transfer. The three cable management assemblies 202A, 202B, and 202C shown in FIGS. 2A, 2B, and 2C illustrate three techniques and associated structures for attaining a suitably high conductive heat transfer at hinge connections. Cable management assembly 202A depicted in FIG. 2A has hinges 230A in the form of resilient flexible metal sheeting that bends as the cable management arm 202A in retracted and extends for extension of the arm 202A. Similarly, the arm members 212A, 212B can be constructed from a resilient or flexible heat pipe.

Cable management arm 202B illustrated in FIG. 2B includes thermally conductive sheeting 232 extending between adjacent segments coupled by hinges 230 that may present a relatively high resistance to thermal conductivity. The sheeting 232 conducts heat between segments.

Cable management arm 202C shown in FIG. 2C transfers heat from each segment to the rack or building chilled water by attachment of supply and return fluid tubes 234 to the multiple segments, thereby transferring heat between adjacent segments and to the central heat sink of the system.

In either the liquid cooling loop approach or the thermal conductive material approach, extended surfaces may be added to the cable management arm to enhance heat transfer within practical space limits.

In some configurations, the high-conductivity strip and/or cold plate 224 may be replaced by a thermal conductor of heat pipe coupled to the rack and extending the length of the rack to transfer heat to a cooling source at the rack base. The cooling source may be a coupling to a refrigeration source, a coupling to building-cooled water, and the like.

Figure 3:
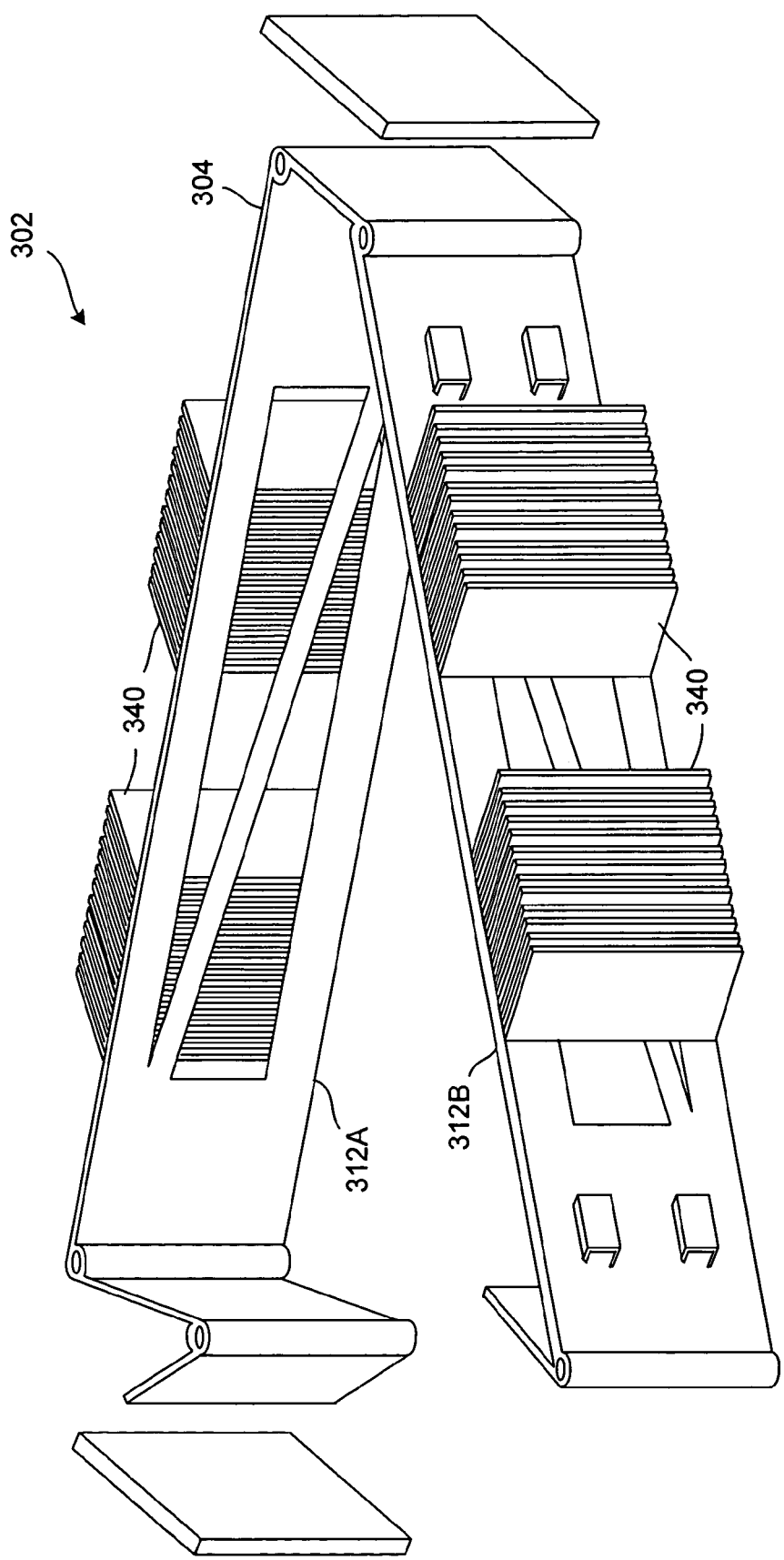
FIG. 3 is a schematic pictorial perspective view diagram that depicts another embodiment of a cable management assembly configured with another different type of integrated heat exchanger including heat exchanger fins.

Referring to FIG. 3, a schematic pictorial perspective view diagram shows another embodiment of a cable management assembly 302 configured with another different type of integrated heat exchanger 304. Multiple fins 340 may be coupled to arm members 312A, 312B of the cable management assembly 302 to increase the surface area of heat exchange. In other embodiments, a sheet metal cable management arm, for example constructed from copper, can have extended surfaces to enhance heat removal.

Figure 4:
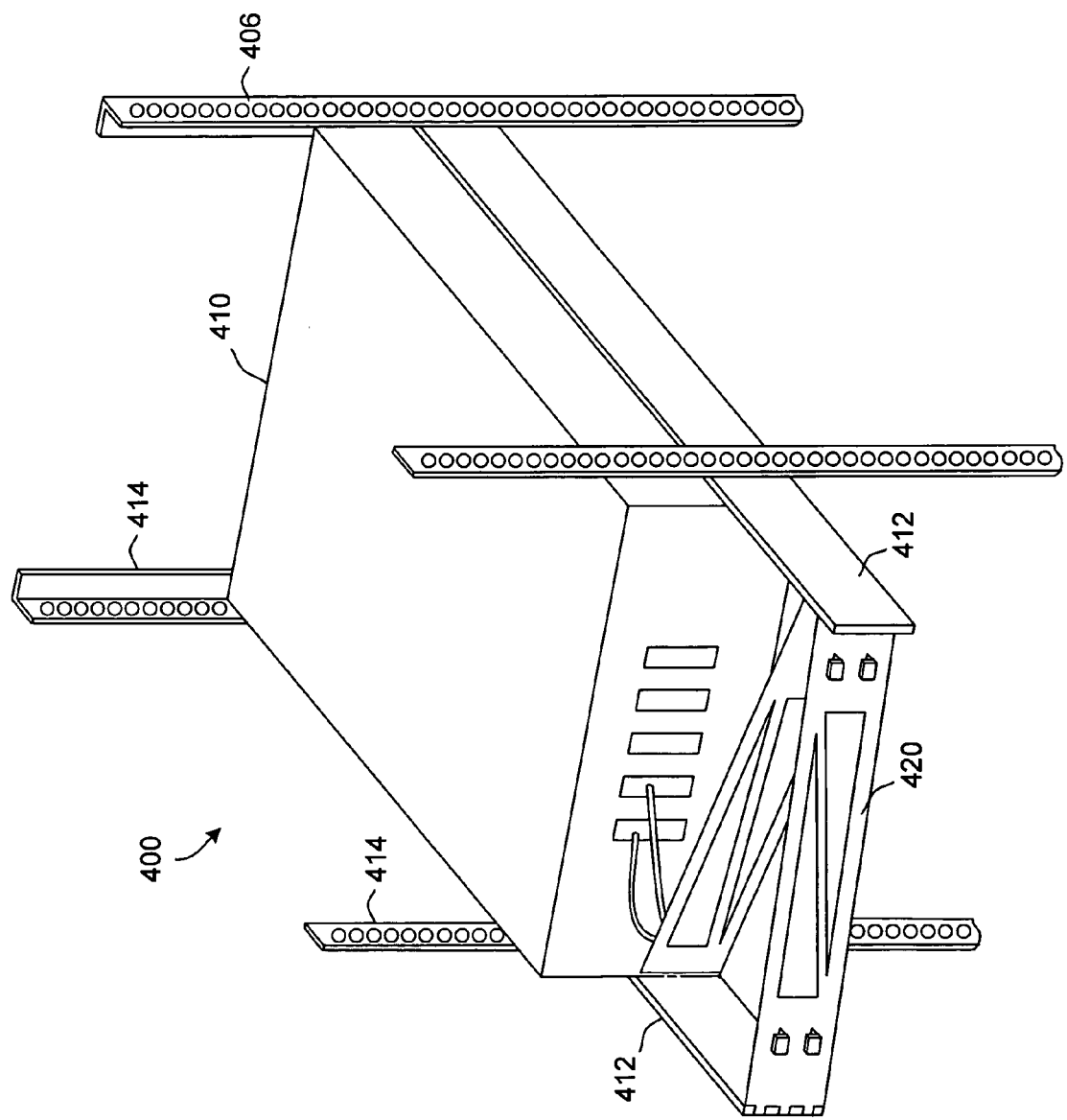
FIG. 4 is a perspective pictorial diagram illustrating an embodiment of a system including a rack configured to hold multiple servers or computers in an arrangement with cable management arms which do not include a heat exchange capability.

Referring to FIG. 4, a perspective pictorial diagram illustrates an embodiment of a system 400 including a rack 406 configured to hold multiple servers or computers 410 in an arrangement with cable management arms 420 which do not include a heat exchange capability. The servers 410 are attached to rails 412 coupled to rack columns 414 that enable the servers 410 to slide in and out of the rack 406. A conventional cable management arm 402 is typically constructed from sheet metal, solid tubing, or plastic materials. In a typical arrangement, hot air is exhausted from the rear of the servers 410 over the cable management arms 402.

In contrast, the assemblies depicted in FIGS. 1A, 1B, 2, and 3 have cable management arms configured to enable thermal conduction of the heat generated by servers and/or other electrical or electronic equipment. The particular examples show a liquid loop cooling arrangement which enable to coolant to flow within tubes and an arrangement using thermal conductive materials such as copper, heat pipes, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A cable management assembly configured for usage in an electronic and/or electrical equipment rack assembly comprising:
   at least two arm members;
   at least one flexible coupling configured to attach two of the at least two arm members; and
   connectors configured to flexibly attach an electronic and/or electrical equipment component to an electronic and/or electrical equipment rack, the at least two arm members, the at least one flexible coupling, and the connectors constructed from a material that removes heat from interior to the rack and connected in a configuration that draws the removed heat to a heat sink element.

2. The assembly according to claim 1 further comprising:
   the at least two arm members comprising at least one liquid loop cooling tube configured to circulate a liquid coolant; and
   a heat exchanger coupled to the at least one liquid loop cooling tube and configured to cool the circulating liquid coolant and return the cooled circulating liquid to the at least one liquid loop cooling tube.

3. The assembly according to claim 2 further comprising:
   a pump configured to pump the circulating liquid through the at least one liquid loop cooling tube and the heat exchanger.

4. The assembly according to claim 2 further comprising:
   the heat exchanger configured to cool the circulating liquid by refrigeration or by transfer from a chilled water supply.

5. The assembly according to claim 2 further comprising:
   a liquid loop cooling tube configured in a plurality of rigid segments coupled by flexible tubing segments, the tube comprising walls formed about a hollow lumen enabling circulation of a liquid coolant, the flexible tubing segments configured to enable hinge functionality and extension and retraction of the cable management assembly; and
   at least one retention element coupled to the liquid loop cooling tube in a configuration adapted to retain electronic and/or electrical equipment cabling.

6. The assembly according to claim 2 further comprising:
   a liquid loop cooling tube routed through at least one electronic and/or electrical equipment component and extending exterior to the electronic and/or electrical equipment component in the electronic and/or electrical equipment rack.

7. The assembly according to claim 1 further comprising:
   the at least two arm members comprising a plurality of segments constructed from a high thermal conductivity material configured to transfer heat by convection and/or conduction; and
   a high-conductivity strip and/or cold plate coupled to the segment plurality and configured to sink transferred heat from the segment plurality.

8. The assembly according to claim 6 further comprising:
   the high-conductivity strip and/or cold plate configured to cool the circulating liquid by refrigeration or by transfer from a chilled water supply.

9. The assembly according to claim 6 further comprising:
   the segment plurality configured in a plurality of rigid segments coupled by hinge elements enabling extension and retraction of the cable management assembly; and
   at least one retention element coupled to the segment plurality in a configuration adapted to retain electronic and/or electrical equipment cabling.

10. The assembly according to claim 1 further comprising:
    a plurality of fins coupled to the at least two arm members.

11. An electronic and/or electrical equipment rack assembly comprising:
    an electronic and/or electrical equipment rack;
    a plurality of sliding rails coupled to the rack and configured to slideably attach an electronic and/or electrical equipment component to the rack; and
    at least one cable management assembly coupled to the rack comprising:
      at least two arm members;
      at least one flexible coupling configured to attach two of the at least two arm members; and
      connectors configured to flexibly attach the electronic and/or electrical equipment component to the rack, the at least two arm members, the at least one flexible coupling, and the connectors constructed from a material that removes heat from interior to the rack and connected in a configuration that draws the removed heat to a heat sink element.

12. The assembly according to claim 11 further comprising:
    the at least two arm members comprising at least one liquid loop cooling tube configured to circulate a liquid coolant; and
    a heat exchanger coupled to the at least one liquid loop cooling tube and configured to cool the circulating liquid coolant and return the cooled circulating liquid to the at least one liquid loop cooling tube.

13. The assembly according to claim 11 further comprising:
    the at least two arm members comprising a plurality of segments constructed from a high thermal conductivity material configured to transfer heat by convection and/or conduction; and
    a high-conductivity strip and/or cold plate coupled to the segment plurality and configured to sink transferred heat from the segment plurality.

14. The assembly according to claim 11 further comprising:
- the at least two arm members comprising a plurality of segments constructed from a high thermal conductivity material configured to transfer heat by convection and/or conduction; and
- a high-conductivity strip and/or cold plate coupled to the segment plurality and configured to sink transferred heat from the segment plurality.

15. The assembly according to claim 11 further comprising:
- a cooling source coupled to the electronic and/or electrical equipment rack and configured to conduct heat to a refrigeration source and/or building cooled water.

16. The assembly according to claim 11 further comprising:
- a heat pipe coupled to the electronic and/or electrical equipment rack and configured to conduct heat to a refrigeration source and/or building cooled water.

17. A method for cooling interior to an electronic and/or electrical equipment rack comprising:
- mounting at least one electronic and/or electrical equipment component in the rack;
- mounting signal and or power cabling of the at least one electronic and/or electrical equipment component on at least one cable management assembly;
- drawing airflow through the rack across at least one electronic and/or electrical equipment component whereby heat is transferred from the at least one component to air; and
- conducting and/or convecting heat through the at least one cable management assembly to a heat sink.

18. The method according to claim 17 further comprising:
- circulating liquid coolant fluid through the cable management assembly;
- cooling air passing over the cable management assembly by heat transfer to the liquid cooling fluid;
- circulating the liquid coolant fluid through a heat exchanger; and
- cooling the liquid coolant fluid at the heat exchanger by transfer to a chilled water supply and/or refrigeration.

19. The method according to claim 17 further comprising:
- conducting and/or convecting heat through the cable management assembly constructed of a material with high thermal conductivity;
- cooling air passing over the cable management assembly by heat transfer to the material with high thermal conductivity;
- transferring heat on the cable management assembly to a high-conductivity strip and/or cold plate.

20. The method according to claim 19 further comprising:
- cooling the high-conductivity strip and/or cold plate by heat transfer to a chilled water supply and/or refrigeration.

\* \* \* \* \*